(12) United States Patent
Roy et al.

(10) Patent No.: US 10,930,493 B2
(45) Date of Patent: Feb. 23, 2021

(54) LINERLESS CONTINUOUS AMORPHOUS METAL FILMS

(71) Applicant: Applied Materials, Inc., Santa Clara, CA (US)

(72) Inventors: Susmit Singha Roy, Mountain View, CA (US); Yong Wu, Mountain View, CA (US); Srinivas Gandikota, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/596,647

(22) Filed: Oct. 8, 2019

(65) Prior Publication Data
US 2020/0135456 A1 Apr. 30, 2020

Related U.S. Application Data

(60) Provisional application No. 62/752,334, filed on Oct. 29, 2018.

(51) Int. Cl.
*H01L 21/02* (2006.01)
*H01L 21/324* (2006.01)

(52) U.S. Cl.
CPC .. *H01L 21/02208* (2013.01); *H01L 21/02238* (2013.01); *H01L 21/02592* (2013.01); *H01L 21/324* (2013.01)

(58) Field of Classification Search
CPC ......... H01L 21/02238; H01L 21/02208; H01L 21/02592; H01L 21/324; C23C 16/00; C23C 16/08; C23C 16/14; C23C 16/18; C23C 16/45557
See application file for complete search history.

(56) References Cited

U.S. PATENT DOCUMENTS

| | | | | |
|---|---|---|---|---|
| 4,617,087 A | * | 10/1986 | Iyer | ...................... C23C 16/0281 134/1 |
| 4,751,101 A | * | 6/1988 | Joshi | ....................... C23C 16/14 427/124 |
| 6,387,790 B1 | | 5/2002 | Domenicucci et al. | |
| 9,190,392 B1 | * | 11/2015 | Shinde | .................. H01L 23/481 |
| 2005/0106919 A1 | * | 5/2005 | Layadi | .............. H01L 21/76877 439/290 |

(Continued)

FOREIGN PATENT DOCUMENTS

JP 2016-186094 A 10/2016

OTHER PUBLICATIONS

International Search Report dated Feb. 25, 2020 for Application No. PCT/US2019/055210.

*Primary Examiner* — Eduardo A Rodela
(74) *Attorney, Agent, or Firm* — Patterson + Sheridan, LLP

(57) ABSTRACT

Embodiments described herein generally relate to methods of depositing thin films and, more particularly, to depositing metal thin films. The methods herein provide a nucleation free conversion (NFC) approach which involves forming an amorphous silicon layer over the dielectric layer, and performing an NFC process which acts to convert the amorphous silicon layer into a thin metal film. In some embodiments, the NFC process is performed multiple times until the resulting thin metal film is continuous. A bulk metal is formed over the thin metal film.

19 Claims, 5 Drawing Sheets

(56) References Cited

U.S. PATENT DOCUMENTS

| | | | |
|---|---|---|---|
| 2011/0163449 A1* | 7/2011 | Kelly | H01L 23/485 |
| | | | 257/750 |
| 2015/0125606 A1* | 5/2015 | Watanabe | C23C 16/08 |
| | | | 427/253 |
| 2017/0179036 A1* | 6/2017 | Chen | H01L 21/28556 |
| 2017/0263455 A1* | 9/2017 | Watanabe | C23C 16/45557 |
| 2017/0373079 A1 | 12/2017 | Sharangpani et al. | |
| 2018/0218911 A1 | 8/2018 | Hung et al. | |
| 2018/0240682 A1 | 8/2018 | Lai et al. | |
| 2018/0247821 A1 | 8/2018 | Chen et al. | |
| 2020/0243341 A1* | 7/2020 | Wu | H01L 21/76876 |

* cited by examiner

LINERLESS CONTINUOUS AMORPHOUS METAL FILMS

CROSS-REFERENCE TO RELATED APPLICATIONS

This application claims priority to U.S. Provisional Patent Application No. 62/752,334, filed Oct. 29, 2018, which is herein incorporated by reference in its entirety.

BACKGROUND

Field

Embodiments described herein generally relate to methods of depositing thin films and, more particularly, to depositing metal thin films.

Description of the Related Art

As circuit integration increases, the need for greater uniformity and process control regarding layer thickness increases. As a result, various technologies have been developed to deposit layers on substrates in a cost-effective manner, while maintaining control over the characteristics of the layer. Chemical vapor deposition (CVD) is one of the most common deposition processes employed for depositing layers on a substrate. CVD is a flux-dependent deposition technique that requires precise control of the substrate temperature and the precursors introduced into the processing chamber in order to produce a desired layer of uniform thickness. These requirements become more critical as substrate size increases, creating a need for more complexity in chamber design and gas flow techniques to maintain adequate uniformity.

A variant of CVD that demonstrates excellent step coverage is atomic layer deposition (ALD). ALD is based upon atomic layer epitaxy and employs chemisorption techniques to deliver precursor molecules on a substrate surface in sequential cycles. The cycle exposes the substrate surface top to a first precursor, a purge gas, a second precursor, and the purge gas. The first and second precursors react to form a product compound as a film on the substrate surface. The cycle is repeated to form the layer to a desired thickness. Due to the increasing integration of semiconductor circuitry, tungsten has been used for superior step coverage. As a result, deposition of tungsten employing CVD techniques enjoys wide application in semiconductor processing due to the high throughput of the process. Depositing tungsten by conventional CVD and ALD methods, however, has disadvantages.

For example, ALD processes deposit tungsten films into vias containing high aspect ratios, whereas conventional CVD processes will usually cause similar vias to "pinch-off" and not completely fill features formed in the dielectric layers formed on a substrate. Additionally, ALD tungsten films do not stick well to silicon or silicon oxide substrate surfaces. Therefore, a titanium nitride barrier/glue layer is used to improve the adhesion. However, the titanium nitride barrier/glue layer takes up space in the formed features and titanium nitride does not conduct well, resulting in very high resistance that affects the performance of the formed metal contact. The deposition of the titanium nitride layer can also be time consuming and adds additional complexity to the overall process.

Accordingly, there is a need for improved techniques to deposit tungsten layers with no barrier/glue layer and results in a bulk metal containing contact that has a low resistance.

SUMMARY

One or more embodiments described herein relate to methods for forming a thin film.

In one embodiment, a method of filling a feature formed on a surface of a substrate includes forming a continuous metal layer on a feature formed on a surface of a substrate, wherein a process of forming the continuous metal layer comprises: (a) forming an amorphous silicon layer on exposed surfaces of the feature; (b) converting the formed amorphous silicon layer to a metal thin film, wherein the process of converting the amorphous silicon layer comprises exposing the amorphous silicon layer to a metal containing precursor until substantially all of the silicon atoms in the amorphous silicon layer are replaced by one or more metal atoms found in the metal containing precursor; and (c) repeating (a) and (b) at least twice, and until a continuous thin film containing the metal atoms is formed on the surface of the feature; and filling the feature formed on the substrate surface by forming a bulk metal layer over the formed continuous thin film.

In another embodiment, a method for forming a thin film on the surface of a substrate includes forming a continuous metal layer on a feature formed on a surface of a substrate, wherein a process of forming the continuous metal layer comprises: (a) forming an amorphous silicon layer on exposed surfaces of the feature; (b) converting the formed amorphous silicon layer to a metal thin film, wherein the process of converting the amorphous silicon layer comprises exposing the amorphous silicon layer to a metal containing precursor until substantially all of the silicon atoms in the amorphous silicon layer are replaced by one or more metal atoms found in the metal containing precursor; and (c) repeating (a) and (b) at least twice, and until a continuous thin film containing the metal atoms is formed on the surface of the feature and the thin film is between about 10 angstroms and about 100 angstroms; and filling the feature formed on the substrate surface by forming a bulk metal layer over the formed continuous thin film.

In yet another embodiment, a method for forming a thin film includes forming a continuous metal layer on a feature formed on a surface of a substrate, wherein a process of forming the continuous metal layer comprises: (a) forming an amorphous silicon layer on exposed surfaces of the feature, wherein the amorphous silicon layer is between about 10 angstroms and about 40 angstroms; (b) converting the formed amorphous silicon layer to a metal thin film, wherein the process of converting the amorphous silicon layer comprises exposing the amorphous silicon layer to a metal containing precursor until substantially all of the silicon atoms in the amorphous silicon layer are replaced by one or more metal atoms found in the metal containing precursor; and (c) repeating (a) and (b) at least twice, and until a continuous thin film containing the metal atoms is formed on the surface of the feature and the thin film has a thickness of between about 10 angstroms and about 100 angstroms; and filling the feature formed on the substrate surface by forming a bulk metal layer over the formed continuous thin film.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

In the following description, numerous specific details are set forth to provide a more thorough understanding of the embodiments of the present disclosure. However, it will be apparent to one of skill in the art that one or more of the embodiments of the present disclosure may be practiced without one or more of these specific details. In other instances, well-known features have not been described in order to avoid obscuring one or more of the embodiments of the present disclosure.

Embodiments described herein generally relate to methods of depositing thin films and, more particularly, to depositing metal thin films. The methods herein provide a nucleation free conversion (NFC) approach which involves providing a substrate and forming a dielectric layer over the substrate. An amorphous silicon (α-Si) layer is formed over the dielectric layer. The NFC process is performed which acts to convert the amorphous silicon layer into a thin metal film after performing the NFC process. However, the resulting thin metal film is often discontinuous due to the significant volume reduction that occurs during the conversion portion of the NFC process, resulting in segregated islands of metal. Therefore, in one or more embodiments described herein, the NFC process may be performed multiple times, in which the amorphous silicon layer fills the gaps left by the previous rounds of the NFC process and the amorphous silicon is then converted into a thin metal film. These process steps are performed multiple times until the resulting thin metal film is continuous. When the resulting thin metal film is continuous, a bulk metal is formed over the thin metal film. The methods described herein are advantageous because the NFC approach acts to make the resistance (R) of the formed metal containing feature (e.g., metal contact, via or trench) smaller than conventionally formed metal containing features. Additionally, the NFC approach described herein also creates a bulk metal with good material coverage due to the continuous nature of the formed metal film.

Figure 1:
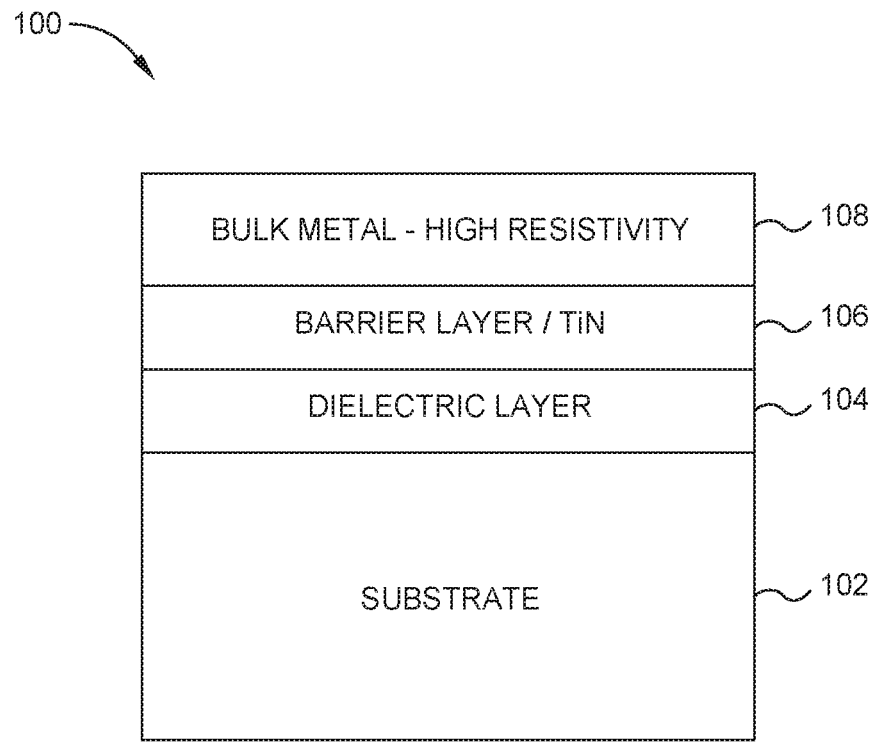
FIG. 1 is a schematic view of a film stack in the prior art.

FIG. 1 is a schematic view of a film stack 100 in the prior art. The film stack 100 includes a dielectric layer 104 disposed on a substrate 102. Although the bulk metal layer 108 can be disposed on the dielectric layer 104, metals such as tungsten do not readily adhere to surfaces of the dielectric layer 104. Therefore, to increase the adhesion of the bulk metal layer 108, such as tungsten (W), to surfaces of the dielectric layer 104, conventional processes use a barrier layer 106 (also called a glue layer) disposed on the dielectric layer 104. The barrier layer 106 is typically a titanium nitride (TiN) film or other similar film. However, the deposition of the barrier layer 106 can be time consuming and adds additional complexity to the overall process. Additionally, the barrier layer 106 does not conduct electricity well, resulting in a very high resistance for a metal contact that contains the bulk metal layer 108 and the barrier layer 106. As such, there is a need for improved methods to deposit thin metals with no barrier layer 106 that will decrease the resistance of a formed metal contact. Embodiments herein include methods that will fulfill this need.

Figure 2:
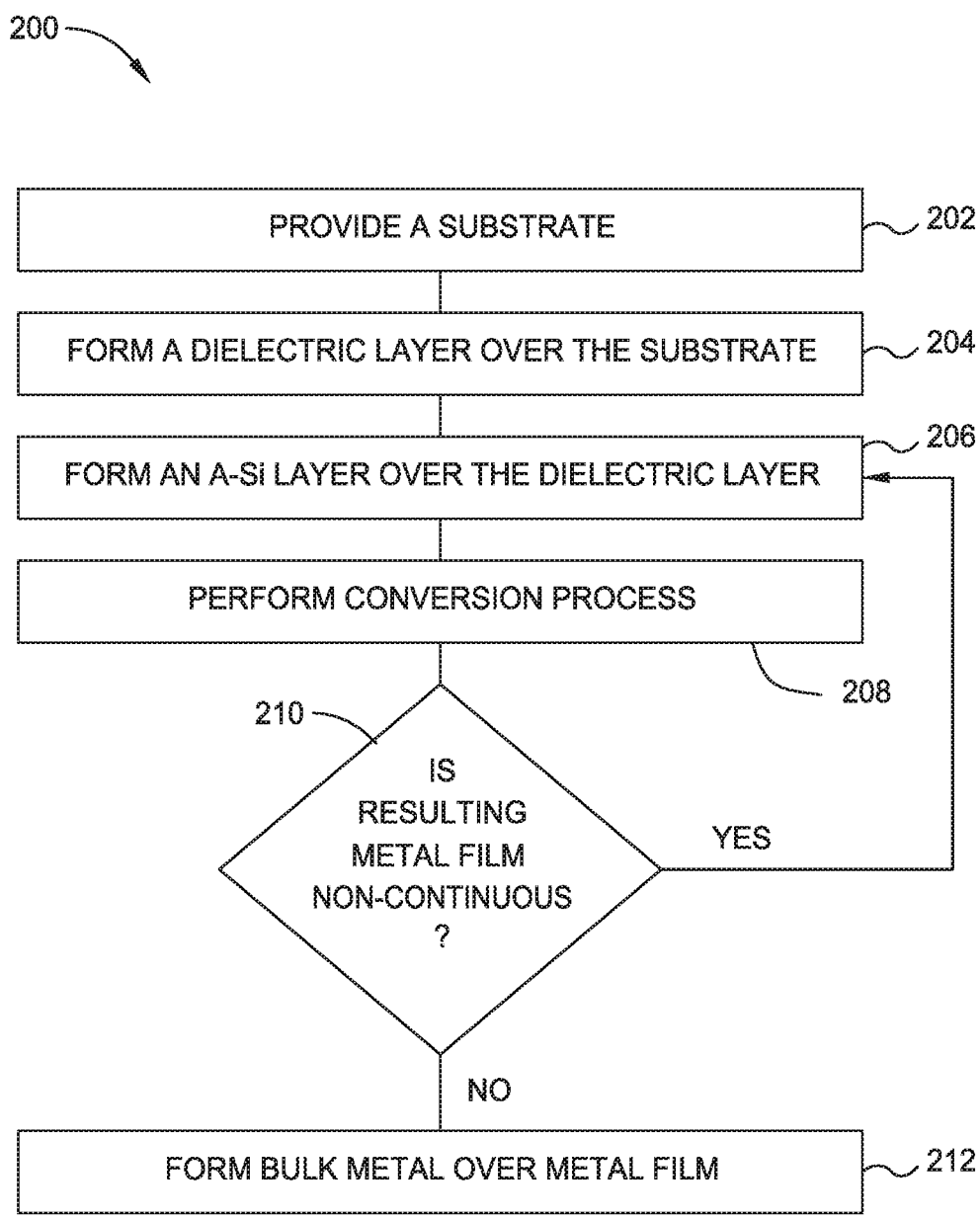
FIG. 2 is a method for forming a film stack according to at least one embodiment described herein.

FIG. 2 is a method 200 for forming a film stack according to at least one embodiment herein. The method 200 acts to create a film stack that can deposit thin metals with no barrier layer, which will ultimately decrease the resistance of the metal in a metal containing feature (e.g., metal contact, via or trench) formed on the surface of a substrate, making the metal containing feature more conductive and thus improving a device's RC constant. FIGS. 3A-3J are schematic views of film stacks 300 according to at least some embodiments described herein that represent the film stack 300 structure at each of block of the method 200.

Figure 3A:
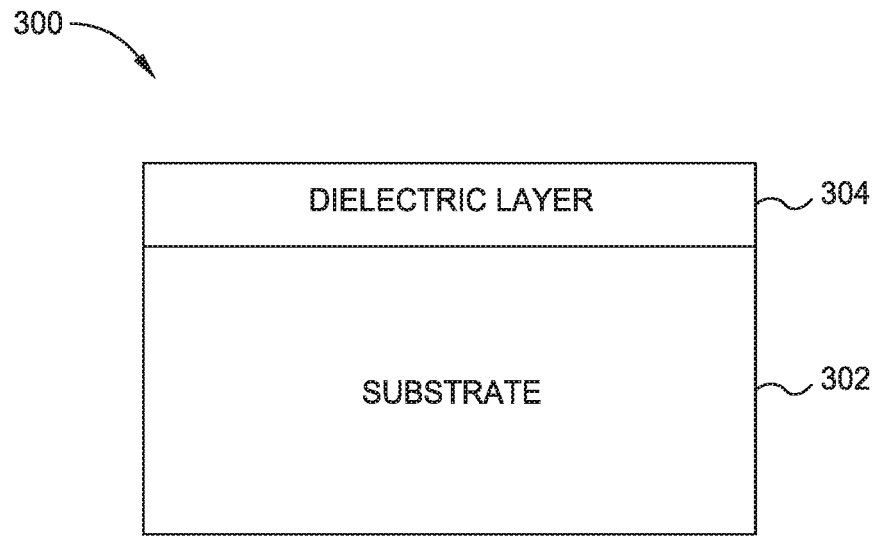
FIG. 3A is a schematic view of a film stack according to at least one embodiment described herein.

In block 202, a substrate 302 is provided as shown in FIG. 3A. The substrate 302 can consist essentially of a dielectric or semiconductor material, such as silicon, silicon oxide, gallium nitride (GaN) or aluminum oxide. As used in this regard, "consists essentially of" means that the substrate includes greater than 95%, 98%, 99%, or 99.5% of the stated material on an atomic percent basis. A skilled artisan will recognize that the terms such as silicon oxide and aluminum oxide do not convey any specific atomic ratio. These materials may be either stoichiometric or non-stoichiometric.

In block 204, a dielectric layer 304 is formed over the substrate 302, also shown in FIG. 3A. The dielectric layer 304 can also consist essentially of silicon nitride, silicon oxide, or aluminum oxide.

Figure 3B:
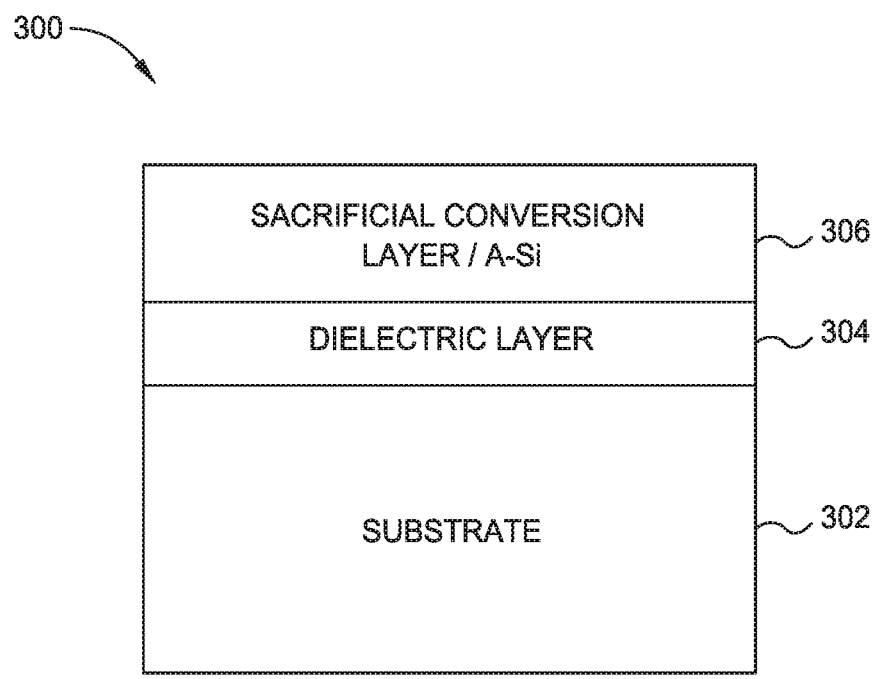
FIG. 3B is a schematic view of a film stack according to at least one embodiment described herein.

In block 206, an amorphous silicon layer 306 is formed over the dielectric layer 304, as shown in FIG. 3B. In some embodiments, the substrate surface is maintained at a temperature between about 250 degrees Celsius and about 500 degrees during the NFC process. Precursors used in block 206 can include $SiH_4$ and $Si_2H_6$ with $H_2$, which can be thermal or a plasma enhanced process. In some embodiments, the plasma enhanced process occurs at a radio frequency (RF) power range between about 50 W and about 500 W. Gas flows in block 206 can between about 100 sccm and about 1000 sccm.

In block 208, the amorphous silicon layer 306 is converted to a thin film that includes a metal. In one embodiment, the conversion process includes the formation of a metal film by a replacement reaction with the silicon material in the formed amorphous silicon layer. The conversion process includes the exposure of the silicon layer to a halogen based metal containing precursor, containing metals such as tungsten, tantalum, molybdenum, titanium, etc. and halogens such as F, Cl, Br and I. The conversion reaction will generally include the following reaction:

$$2WF_6 + 3Si \rightarrow 2W + 3SiF_4$$

In some embodiments, block 208 of the NFC process is performed at a pressure between about 5 Torr and about 20 Torr. In some embodiments, the substrate surface is maintained at a temperature between about 250 degrees Celsius and about 500 degrees during the NFC process. Precursors used in block 206 can include tungsten hexafluoride ($WF_6$) with $H_2$ and/or a carrier gas, which can be plasma enhanced. In some embodiments, the plasma enhanced process occurs at an RF power range between about 50 W and about 500 W. Gas flows in block 208 can be between about 100 sccm and about 1000 sccm. The resulting resistivity of a bulk metal layer 310 can be less than or equal to about 20 μΩ-cm, such as about 15 μΩ-cm.

Figure 3C:
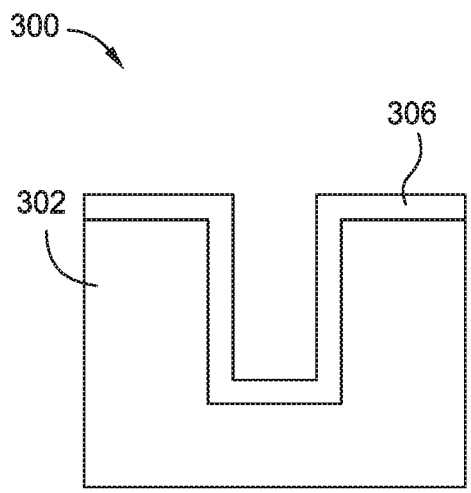
FIG. 3C is a schematic view of a film stack according to at least one embodiment described herein.

The resulting thin film metal can consist essentially of tungsten. At least one embodiment of this process sequence is shown in FIGS. 3C-3H. FIG. 3C is the film stack 300 with the amorphous silicon film 306 initially formed over the exposed surface of the substrate 302 before the conversion step of the process begins. The dielectric layer 304 is not shown in FIGS. 3C-3H for clarity purposes. The amorphous silicon film 306 can be about 20 angstroms thick, or in the range of about 10 angstroms to 40 angstroms thick. If the thickness of the deposited amorphous silicon film 306 is too large there is a chance that not all of the silicon layer will be completely converted (i.e., removed and replaced by the metal material) in the subsequent processing step.

Figure 3D:
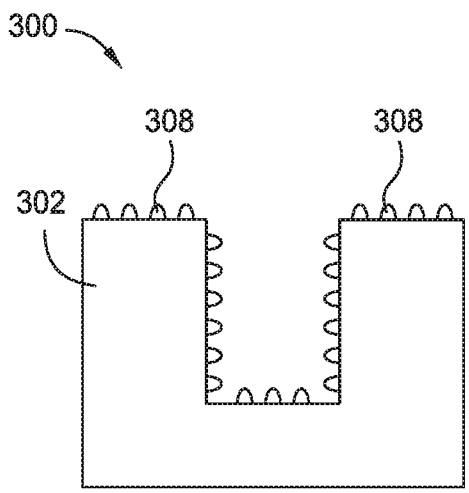
FIG. 3D is a schematic view of a film stack according to at least one embodiment described herein.

FIG. 3D represents the film stack 300 after a first round of performing the processes found in blocks 206 and 208 of the method 200 has been performed, which is also sometimes referred to herein as the NFC process. However, although the process results in an NFC film 308, the NFC film 308 is discontinuous and thus includes segregated islands of metal. The segregated islands result because during the NFC process, the conversion process of the amorphous silicon film 306 to the metal containing NFC film 308 involves a significant volume reduction, thereby causing the resulting NFC film 308 to be discontinuous as shown in FIG. 3D. For example, assuming an amorphous silicon film 306 of about 20 angstroms, the volume reduction can result in segregated islands of a metal that are about 10 angstroms in size. The volume reduction and resulting segregated islands occur especially in very high aspect ratio structures like 3D NAND structures. This in-turn creates issues of coverage when the bulk metal layer 310 (FIG. 3J) is deposited. As such, the method 200 creates a resulting continuous NFC film 308 to help prevent this problem.

Figure 3E:
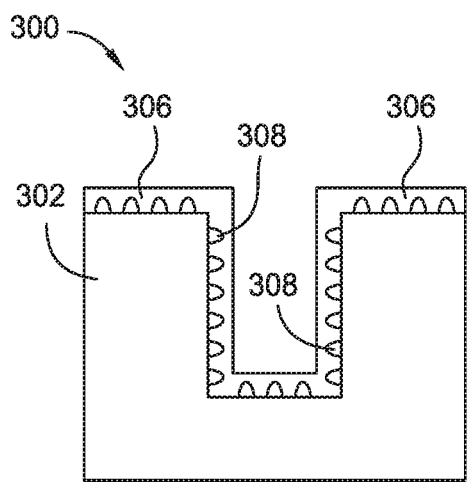
FIG. 3E is a schematic view of a film stack according to at least one embodiment described herein.

To create a continuous NFC film 308, block 210 determines if the resulting NFC film 308 is non-continuous. If no, the method can proceed to block 212. However, if yes, the blocks 206 and 208 of the method 200 will be repeated as many times as necessary to create a continuous NFC film 308. For example, FIG. 3D depicts a non-continuous NFC film 308 as described above. Therefore, block 210 will seek to repeat another round (a second round) of the blocks 206 and 208 of the method 200 and proceed to what is shown in FIG. 3E. In FIG. 3E, another amorphous silicon layer 306 is formed over the non-continuous NFC layer 308. The additional round of amorphous silicon layer 306 can also be about 20 angstroms, or in the range of about 10 angstroms to 40 angstroms. The amorphous silicon layer 306 may be completely amorphous or have an amorphous phase that contains very small grains.

Figure 3F:
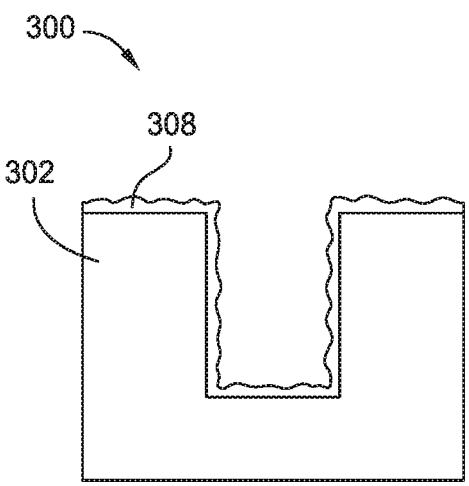
FIG. 3F is a schematic view of a film stack according to at least one embodiment described herein.
Figure 3G:
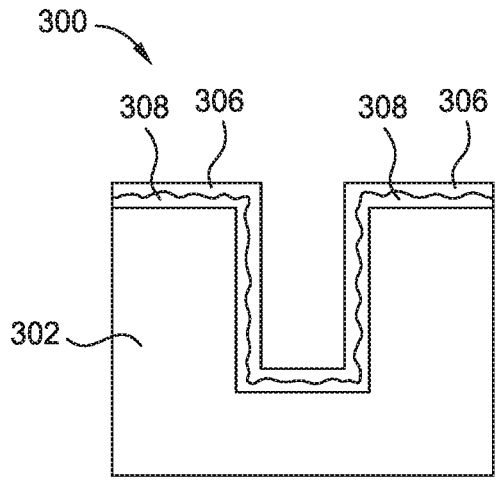
FIG. 3G is a schematic view of a film stack according to at least one embodiment described herein.
Figure 3H:
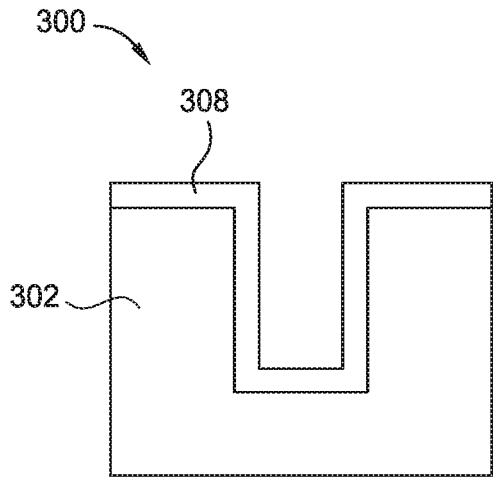
FIG. 3H is a schematic view of a film stack according to at least one embodiment described herein.
Figure 3:
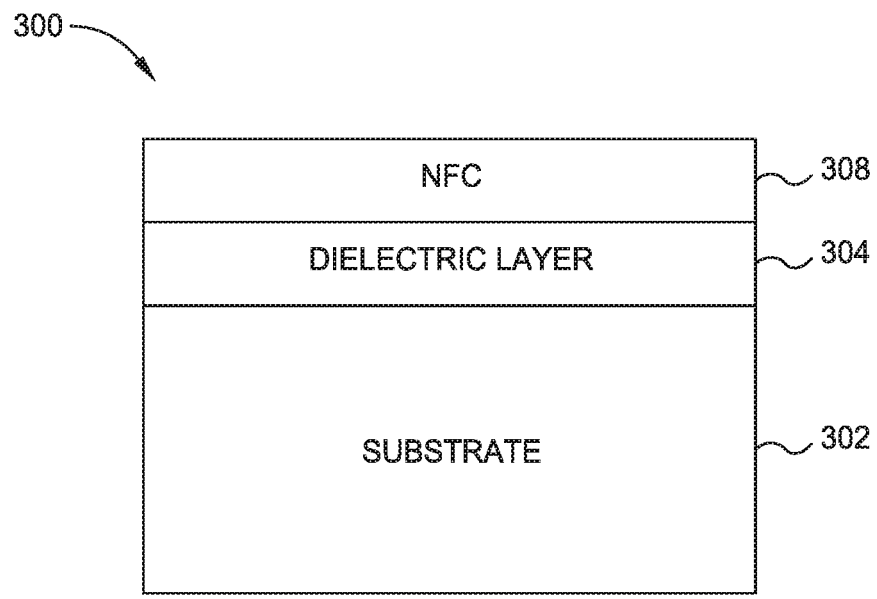
FIG. 3I is a schematic view of a film stack according to at least one embodiment described herein.
FIG. 3J is a schematic view of a film stack according to at least one embodiment described herein.

While not intending to be bound by theory, the amorphous structure of the amorphous silicon film 306 is believed to enhance the ability of the conversion process performed in block 208 to completely convert the amorphous silicon film 306 to a metal layer versus a non-amorphous crystalline containing silicon film due to the difference or degree of bonding of the silicon atoms in these different crystalline structures. Therefore, as shown, the second round of the amorphous silicon film 306 partially fills the gaps between the segregated islands as shown in FIGS. 3D-3E and the performance of blocks 206 and 208 of the method 200 results in the NFC film 308 shown in FIG. 3F. The second round of the NFC film 308, with the volume reduction as described above, can result in a thickness of about 20 angstroms (10 angstroms+10 angstroms). However, the second round of blocks 206 and 208 may create an imperfect film that does not completely cover the gaps formed in the prior round. In this embodiment, in block 210 it may be found that the NFC film 308 in FIG. 3F is still not continuous, and another round (third round) of the blocks 206 and 208 of the method 200 is necessary to form what is shown in FIG. 3G. In FIG. 3G, like FIG. 3E, another amorphous silicon layer 306 is formed over the non-continuous NFC layer 308. In this embodiment, the third round of the amorphous silicon layer 306 fills the remaining gaps shown in FIGS. 3F-3G. Again, the amorphous silicon film 306 forms within the gaps evenly on the dielectric layer 304, resulting in a continuous NFC layer 308 as shown in FIG. 3H. The amorphous silicon layer 306 can again be about 20 angstroms, or in the range of about 10 angstroms to about 40 angstroms. However, this is just one embodiment where three rounds of the NFC process are performed. In other embodiments, the NFC process will repeat as many times as necessary until the NFC layer 308 becomes a continuous metal film.

The thickness of the final resulting NFC layer 308 as a continuous metal film can vary depending on, for example, the substrate surface topography and subsequent films that will be deposited thereon and subsequent processes to be performed. In some embodiments, the resulting NFC layer 308 has a thickness equal to about 50 angstroms. In other embodiments, the resulting NFC layer 308 has a thickness in the range of about 1 angstrom to about 200 angstroms, or in the range of about 20 to about 100 angstroms, or in the range of about 40 angstroms to about 100 angstroms.

Figure 3J:
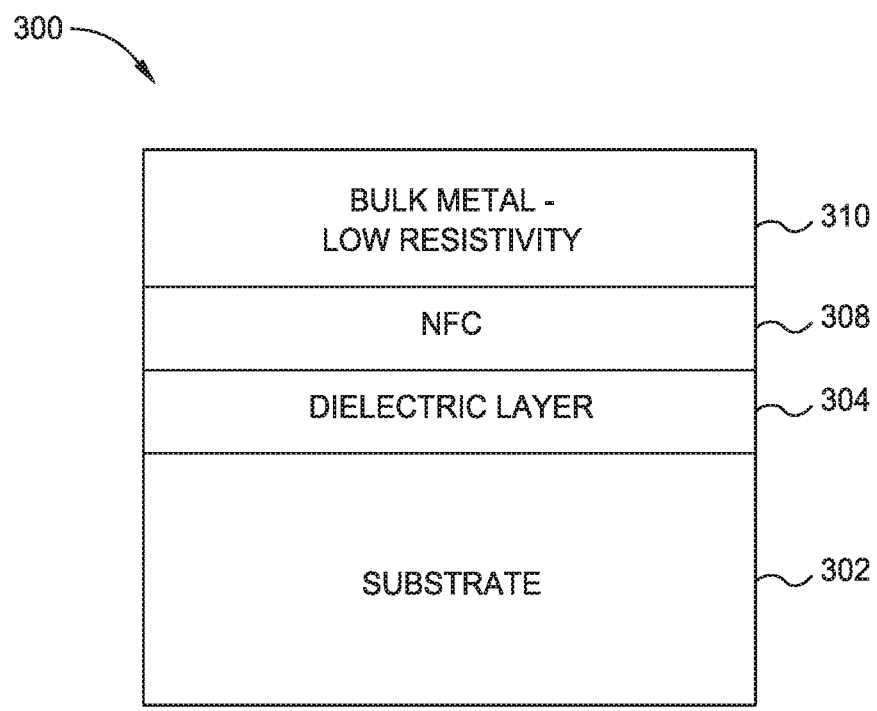

FIG. 3I shows the film stack 300 when the NFC process is complete. Therefore, the amorphous silicon layer 306 is completely converted to the metal containing NFC layer 308. Here, the NFC layer 308 is a continuous thin metal film, which does not contain silicon or at least a significant amount of silicon, which is formed over the dielectric layer 304. In block 212, the bulk metal layer 310 is formed over the NFC layer 308, as shown in FIG. 3J. The contact that contains the bulk metal layer 310 in this embodiment has a lower resistance due the elimination of the barrier layer 106 in FIG. 1. Therefore, a metal contact that contains the formed bulk metal layer 310 is more conductive. Additionally, because the bulk metal layer 310 is formed over a continuous NFC layer 308 in these embodiments, the bulk film has much improved coverage of the substrate surface. As such, the issues of coverage are reduced compared to when the bulk metal layer 310 is deposited over a non-continuous NFC layer 308.

The quality of the amorphous silicon film 306 can be determined based on the hydrogen content of the film, as measured by Rutherford Backscattering Spectrometry (RBS) in combination with Hydrogen Forward Scattering Spectrometry (HFS). In some embodiments, the hydrogen content of the amorphous silicon layer 306 is less than or equal to 6 atomic percent, less than or equal to 5 atomic percent, less than or equal to 4 atomic percent, less than or equal to 3 atomic percent, less than or equal to 2 atomic percent, less than or equal to 1 atomic percent, or less than or equal to 0.5 atomic percent. According to some embodiments, the amorphous silicon layer 306 is covered to the thin metal layer, such as tungsten, at low temperature to provide a film with less fluorine penetration to reduce film peeling. In some embodiments, the amorphous silicon layer 306 is exposed to a first metal precursor at a temperature of less than or equal to about 450 degrees Celsius, less than or equal to about 425 degrees Celsius, less than or equal to about 400 degrees Celsius, less than or equal to about 375 degrees Celsius, or less than or equal to about 350 degrees Celsius. In some embodiments, the amorphous silicon layer 306 is exposed to the first metal precursor at a temperature in the range of about 250 degrees Celsius to about 450 degrees Celsius, or in the range of about 275 degrees Celsius to about 425 degrees Celsius, or in the range of about 300 degrees Celsius to about 400 degrees Celsius.

The relatively low fluorine penetration of some embodiments provides better film adhesion and a lower resistivity for the resulting NFC layer 308. In some embodiments, the fluorine concentration of the resulting NFC layer 308 is less than or equal to about $1\times10^{21}$ atoms/cm$^3$, less than or equal to about $7.5\times10^{20}$ atoms/cm$^3$, or less than or equal to about $5\times10^{20}$ atoms/cm$^3$, or less than or equal to about $2.5\times10^{20}$, or less than or equal to about $1\times10^{20}$ atoms/cm$^3$. In some embodiments, the resistivity of a resulting NFC layer 308 with a thickness of about 20 nm is less than or equal to about 20 μΩ-cm, less than or equal to about 19 μΩ-cm, less than or equal to about 18 μΩ-cm, less than or equal to about 17 μΩ-cm, less than or equal to 16 μΩ-cm, or less than or equal to about 15 μΩ-cm.

While the foregoing is directed to embodiments of the present disclosure, other and further embodiments of the disclosure may be devised without departing from the basic scope thereof, and the scope thereof is determined by the claims that follow.

We claim:

1. A method of filling a feature formed on a surface of a substrate, comprising:
    forming a continuous metal layer on the feature formed on the surface of the substrate, wherein a process of forming the continuous metal layer comprises:
        (a) forming an amorphous silicon layer on exposed surfaces of the feature;
        (b) converting the formed amorphous silicon layer to a metal thin film, wherein the process of converting the amorphous silicon layer comprises exposing the amorphous silicon layer to a metal containing precursor until substantially all of the silicon atoms in the amorphous silicon layer are replaced by one or more metal atoms found in the metal containing precursor, wherein the metal containing precursor includes tungsten, tantalum, molybdenum, or titanium; and
        (c) repeating (a) and (b) at least twice, and until a continuous thin film containing the metal atoms is formed on the surface of the feature, and wherein the process is performed at a pressure between about 5 Torr and about 20 Torr; and
    forming a bulk metal layer over the formed continuous thin film.

2. The method of claim 1, wherein the substrate temperature during the process is maintained at a temperature between about 250 degrees Celsius and about 500 degrees Celsius.

3. The method of claim 1, wherein the process occurs at an RF power range between about 50 W and about 500 W.

4. The method of claim 1, wherein the metal thin film is made of tungsten.

5. The method of claim 1, wherein the substrate is made of materials consisting essentially of silicon nitride, silicon oxide, or aluminum oxide.

6. The method of claim 1, wherein the bulk metal has a resistivity of less than or equal to about 20 μΩ-cm.

7. A method for forming a thin film on a surface of a substrate, comprising:
    forming a continuous metal layer on a feature formed on the surface of the substrate, wherein a process of forming the continuous metal layer comprises:
        (a) forming an amorphous silicon layer on exposed surfaces of the feature;
        (b) converting the formed amorphous silicon layer to a metal thin film, wherein the process of converting the amorphous silicon layer comprises exposing the amorphous silicon layer to a metal containing precursor until substantially all of the silicon atoms in the amorphous silicon layer are replaced by one or more metal atoms found in the metal containing precursor, wherein the metal containing precursor includes tungsten, tantalum, molybdenum, or titanium; and
        (c) repeating (a) and (b) at least twice, and until a continuous thin film containing the metal atoms is formed on the surface of the feature and the thin film is between about 10 angstroms and about 100 angstroms; and
    filling the feature formed on the surface of the substrate by forming a bulk metal layer over the formed continuous thin film.

8. The method of claim 7, wherein the process is performed at a pressure between about 5 Torr and about 20 Torr.

9. The method of claim 7, wherein the substrate temperature during the process is maintained at a temperature between about 250 degrees Celsius and about 500 degrees Celsius.

10. The method of claim 7, wherein the process occurs at an RF power range between about 50 W and about 500 W.

11. The method of claim 7, wherein the metal thin film is made of tungsten.

12. The method of claim 7, wherein the substrate is made of materials consisting essentially of silicon nitride, silicon oxide, or aluminum oxide.

13. The method of claim 7, wherein the bulk metal has a resistivity of less than or equal to about 20 μΩ-cm.

14. A method for forming a thin film, comprising:
    forming a continuous metal layer on a feature formed on a surface of a substrate, wherein a process of forming the continuous metal layer comprises:
        (a) forming an amorphous silicon layer on exposed surfaces of the feature, wherein the amorphous silicon layer is between about 10 angstroms and about 40 angstroms;
        (b) converting the formed amorphous silicon layer to a metal thin film, wherein the process of converting the amorphous silicon layer comprises exposing the amorphous silicon layer to a metal containing precursor until substantially all of the silicon atoms in the amorphous silicon layer are replaced by one or more metal atoms found in the metal containing precursor, wherein the metal containing precursor includes tungsten; and (c) repeating (a) and (b) at least twice, and until a continuous thin film containing the metal atoms is formed on the surface of the feature and the thin film has a thickness of between about 10 angstroms and about 100 angstroms; and filling the feature formed on the surface of the substrate by forming a bulk metal layer over the formed continuous thin film.

15. The method of claim 14, wherein the process is performed at a pressure between about 5 Torr and about 20 Torr.

16. The method of claim 14, wherein the substrate temperature during the process is maintained at a temperature between about 250 degrees Celsius and about 500 degrees Celsius.

17. The method of claim 14, wherein the process occurs at an RF power range between about 50 W and about 500 W.

18. The method of claim 14, wherein the metal thin film is made of tungsten.

19. The method of claim 14, wherein the bulk metal has a resistivity of less than or equal to about 20 μΩ-cm.

\* \* \* \* \*